(12) United States Patent
Mir et al.

(10) Patent No.: US 7,119,530 B2
(45) Date of Patent: Oct. 10, 2006

(54) MOTOR PHASE CURRENT MEASUREMENT USING A SINGLE DC BUS SHUNT SENSOR

(75) Inventors: Sayeed A. Mir, Saginaw, MI (US); Paul M. Fisher, Saginaw, MI (US); Daniel W. Shafer, Linden, MI (US); Samuel J. Underwood, Amiens (FR)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/052,485

(22) Filed: Feb. 4, 2005

(65) Prior Publication Data
US 2006/0176059 A1 Aug. 10, 2006

(51) Int. Cl.
*G01R 13/14* (2006.01)
*H02P 5/40* (2006.01)

(52) U.S. Cl. .................... 324/76.15; 318/801; 318/803
(58) Field of Classification Search .............. 324/76.15
See application file for complete search history.

(56) References Cited

U.S. PATENT DOCUMENTS

| | | | |
|---|---|---|---|
| 4,558,265 A | * | 12/1985 | Hayashida et al. ......... 318/561 |
| 5,349,351 A | * | 9/1994 | Obara et al. ................. 341/141 |
| 5,457,375 A | * | 10/1995 | Marcinkiewicz et al. ... 318/802 |
| 6,392,418 B1 | | 5/2002 | Mir et al. |
| 6,549,871 B1 | | 4/2003 | Mir et al. |
| 6,694,287 B1 | | 2/2004 | Mir et al. |

OTHER PUBLICATIONS

Switched Reluctance Motor Drives (6 pages), http://www.fleadh.co.uk/srm.htm.*

\* cited by examiner

*Primary Examiner*—Vincent Q. Nguyen
(74) *Attorney, Agent, or Firm*—Michael D. Smith

(57) ABSTRACT

A method and system for obtaining motor current measurements from a DC bus current of an inverter that drives a pulse width modulated electric machine is disclosed. The method may include sensing a DC bus current in a sensor located on a bus of an inverter; sampling the DC bus current via an analog to digital converter wherein the sampling is controlled by sampling timing that is based on a pulse width modulation timing of the inverter; and determining three AC phase currents of the motor from the sampled DC bus current.

17 Claims, 14 Drawing Sheets

MOTOR PHASE CURRENT MEASUREMENT USING A SINGLE DC BUS SHUNT SENSOR

BACKGROUND

Most modern vehicles have power steering in which the force exerted by the operator on the steering wheel is assisted by hydraulic pressure from an electric or engine-driven pump. The force applied to the steering wheel is multiplied by the mechanical advantage of a steering gear. In many vehicles, the steering gear is a rack and pinion, while in others it is a recirculating ball type.

Electric power steering has started to replace hydraulic power steering in some vehicles for fuel economy. One way this is accomplished is through the reduction or elimination of losses inherent in traditional steering systems. Therefore, electric power steering typically requires power only on demand. Commonly, in such systems an electronic controller is configured to require significantly less power under a small or no steering input condition. This dramatic decrease from conventional steering assist is the basis of the power and fuel savings. Electric power steering has several additional advantages. The steering feel provided to the operator has greater flexibility and adaptability. Overall system mass savings may also be achieved. Electric power steering is powerplant independent, which means it can operate during an all-electric mode on a vehicle.

Furthermore, polyphase permanent magnet (PM) brushless motors excited with a sinusoidal field provide lower torque ripple, noise, and vibration when compared with those excited with a trapezoidal field. Theoretically, if a motor controller produces polyphase sinusoidal currents with the same frequency and phase as that of the sinusoidal back electromotive force (EMF), the torque output of the motor will be a constant, and zero torque ripple will be achieved. However, due to practical limitations of motor design and controller implementation, there are always deviations from pure sinusoidal back EMF and current waveforms. Such deviations usually result in parasitic torque ripple components at various frequencies and magnitudes. Various methods of torque control can influence the magnitude and characteristics of this torque ripple.

One method of torque control for a permanent magnet motor with a sinusoidal, or trapezoidal back EMF is accomplished by directly controlling the motor phase currents. This control method is known as current mode control. The phase currents are actively measured from the motor phases and compared to a desired profile. The voltage across the motor phases is controlled to minimize the error between the desired and measured phase current. However the current mode control require multiple current sensors and A/D channels to digitize the feedback from current sensors, which would be placed on the motor phases for phase current measurements.

Another method of torque control is termed voltage mode control. In voltage mode control, the motor phase voltages are controlled in such a manner as to maintain the motor flux sinusoidal and motor back emf rather than current feedback is employed. The voltage mode control does not require precise current measurement form multiple current sensors. One application for an electric machine using voltage mode control is the electric power steering system (EPS).

In voltage mode control the amplitude and phase angle of phase current vector is calculated based on the motor back emf, position and motor parameters (e.g., resistance, inductance and back emf constant). A sinusoidal instantaneous line voltage based on the calculated phase and amplitude vector of phase voltage is applied across the motor phases. An instantaneous value of voltage is realized across the phases by applying a pulse width modulated (PWM) voltage the average of which is equal to the desired instantaneous voltage applied at that position of the motor.

There are different methods of profiling the phase voltages in order a achieve a sinusoidal line to line voltage and therefore the phase current in a wye-connected motor. A conventional approach is to apply sinusoidal voltages at the phase terminals. In this method the reference for the applied voltage is at half the dc bus voltage (Vdc/2). In another approach, the phase voltage is referenced to the power supply ground (instead of Vdc/2 as in conventional way). This is achieved by applied a zero voltage for 120 electrical degrees at each phase terminal during one electric cycle. This method increases the voltage resolution while reducing the switching losses.

EPS control systems employing voltage mode control algorithm, uses the amplitude and phase angle of the voltage for torque control. In order to produce the accurate torque from the motor it is important to apply and control both amplitude of the voltage and its phase angle as accurately as possible. Although the voltage mode control does not require the motor current for torque control, the current torque and flux components of motor current are desired to observe the motor parameter changes during the operation and life and diagnostics purposes.

BRIEF SUMMARY

A method and system for obtaining motor current measurements from a DC bus current of an inverter that drives a pulse width modulated electric machine is disclosed. The method may comprise sensing a DC bus current in a sensor located on a bus of an inverter; sampling the DC bus current via an analog to digital converter wherein the sampling is controlled by sampling timing that is based on a pulse width modulation timing of the inverter; and determining three AC phase currents of the motor from the sampled DC bus current

BRIEF DESCRIPTION OF THE DRAWINGS

The following descriptions should not be considered limiting in any way. With reference to the accompanying drawings, like elements are numbered alike.

FIG. 9B is a conceptual diagram of the compare match sampling of an exemplary embodiment of the system;

FIG. 9F is a vector space diagram showing boundary state 110 and its associated duty cycle;

DETAILED DESCRIPTION OF THE PREFERRED EMBODIMENT

Figure 2:
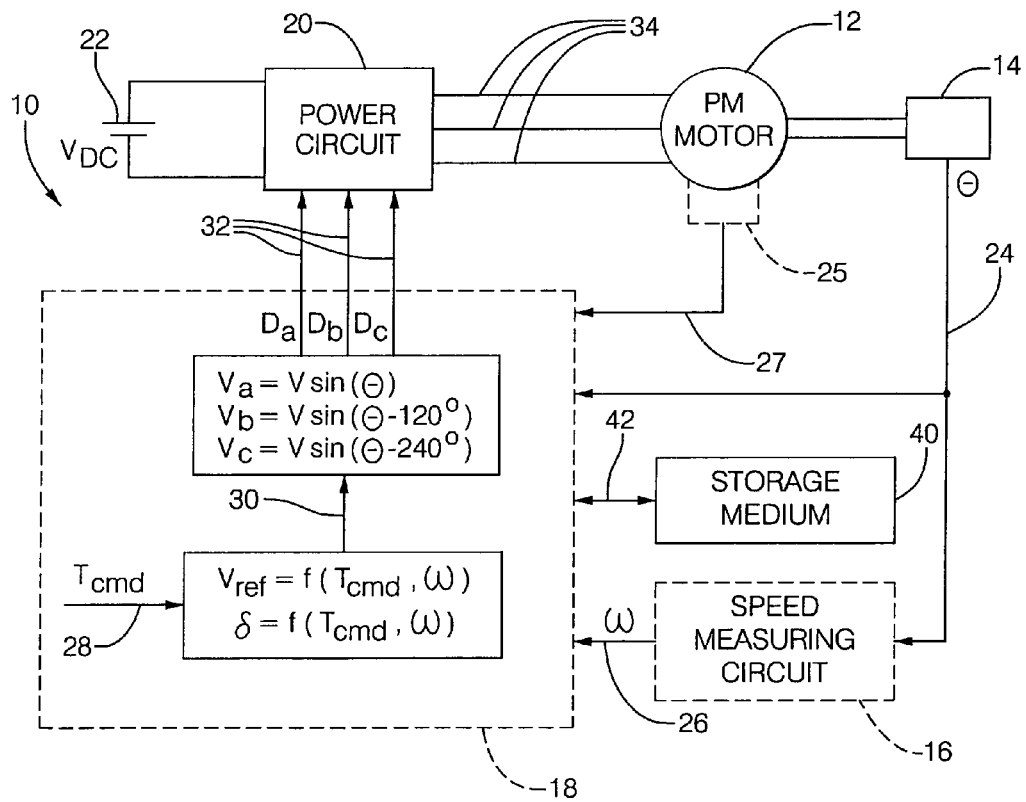
FIG. 2 is a conceptual drawing depicting a phase current measuring controlled PM motor drive system of an exemplary embodiment.

Referring now to the drawings in detail, FIG. 2 depicts a permanent magnet (PM) motor system where numeral 10 generally indicates a system for controlling the torque of a sinusoidally excited PM motor 12. The system includes a rotor position encoder 14, speed measuring circuit 16, controller 18, power circuit or inverter 20 and power source 22.

Figure 1:
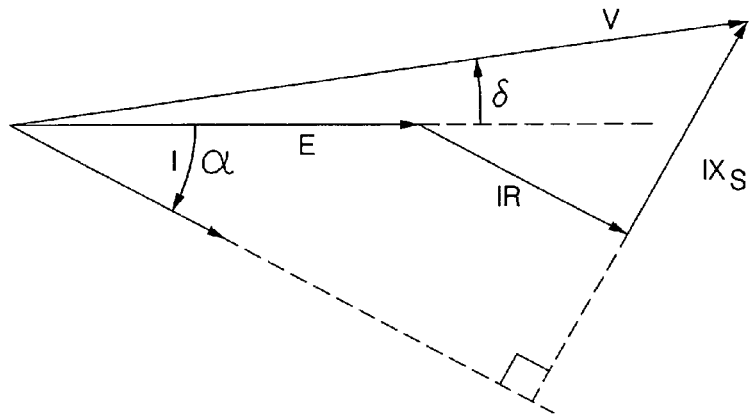
FIG. 1 depicts a phasor diagram for a PM motor.

In the scheme depicted, the torque of the motor 12 is controlled using voltage mode control. Instead of controlling the torque producing current, the controller determines the voltage required for producing the desired torque based on motor equations. The voltage mode control method is based on electric machine operation phasor diagram as shown in FIG. 1. Under steady state operating condition, the voltage phasor $\overline{V}$, back EMF phasor $\overline{E}$ and current phasor $\overline{I}$ of a sinusoidally excited PM motor are governed by:

$$\overline{V} = \overline{E} + \overline{I}R + j\overline{I}X_s \quad (1)$$

where R is the winding resistance, $X_s$ is the phase reactance which is equal to the product of motor inductance $L_s$ and the excitation frequency $\omega$. Here, it is assumed that the angle between back EMF phasor $\overline{E}$ and current phasor $\overline{I}$ is $\alpha$ and the angle between the voltage phasor $\overline{V}$ and the back EMF phasor $\overline{E}$ is $\delta$.

Neglecting motor iron losses, friction and windage losses, the output power of the PM motor is equal to $$P = 3IE \cos \alpha \quad (2)$$

and the output torque is $$T = P/\omega_m \quad (3)$$

where $\omega_m = \omega/$(no. of pole pairs). Based on the phasor diagram, it can be derived that $$V \cos \delta = E + IR \cos \alpha + IX_s \sin \alpha \quad (4)$$

$$V \sin \delta = -IR \sin \alpha + IX_s \cos \alpha \quad (5)$$

Solving equations 4 and 5 yields $$\cos \alpha = \frac{(V\cos\delta - E)R + X_s V \sin\delta}{I(R^2 + X_s^2)} \quad (6)$$

By substituting equation 6 into equation 2, it is obtained that $$P = 3E\frac{(V\cos\delta - E)R + X_s V \sin\delta}{R^2 + X_s^2} \quad (7)$$

From equation 7 and equation 3, the motor torque can be expressed as $$T = 3K_e \frac{(V\cos\delta - K_e\omega_m)R + X_s V \sin\delta}{R^2 + X_s^2} \quad (8)$$

where $K_e = E/\omega_m$ is the EMF constant. It can be seen from equation 8 that the motor torque is dependent on the motor input voltage $\overline{V}$, the motor parameters and operating speed. Hence, given the motor parameters and speed, by controlling the voltage magnitude $\overline{V}$ and its phase angle $\delta$ relative to back EMF $\overline{E}$, it is possible to control the motor torque to a desired value. Equation 8 forms the basis of the control method.

Equation 8 shows that, for a fixed angle $\delta$ between the back EMF $\overline{E}$ and the terminal voltage $\overline{V}$, to maintain a torque equal to the commanded torque with varying speed, the amplitude of motor input voltage has to change. Thus, information of motor parameters (R, Ke and L), rotor speed and position angle is required, but no current feedback is needed, for the controller to develop a signal to produce a desired motor torque. However, this system has limitations because motor parameters can change with temperature and wear during operation. The motor current feedback is used to estimate the motor parameter changes during operation. Also the torque-producing motor current ($I_q$) is also computed for checking the validity of output torque. Thus, by sensing the motor current, the difference between the desired current and the actual current in the machine may be used for motor parameter and also for checking the validity of output torque. This may be used to stabilize the performance of the motor.

Referring to FIG. 2, for the controller 18 to develop the correct voltage needed to produce the desired torque, the position and speed of the rotor is needed. A rotor position encoder 14 is connected to the motor 12 to detect the angular position of the rotor. The encoder 14 may sense the rotary position based on optical detection or magnetic field variations. The encoder 14 outputs a position signal 24 indicating the angular position of the rotor.

From the position signal 24, a speed measuring circuit 16 determines the speed of the rotor and outputs a speed signal 26. The speed may also be directly measured from the rotor using a speed measuring device like tachometer.

The position 24, speed 26, and a torque command signals 28 are applied to the controller 18. The torque command signal 28 is indicative of the desired motor torque. The controller 18 determines the voltage amplitude Vref 30 required to develop the desired torque by using the position, speed, and torque command signals 24, 26, 28, and other fixed motor parameter values. For a three-phase motor, three sinusoidal reference signals that are synchronized with the motor back EMF $\overline{E}$ are required to generate the required motor input voltages. The controller transforms the voltage amplitude signal Vref 30 into three phases by determining phase voltage command signals Va, Vb and Vc from the voltage amplitude signal 30 and the position signal 24 according to the following equations:

$$V_a = V_{ref} \sin(\theta) \tag{9}$$

$$V_b = V_{ref} \sin(\theta - 120°) \tag{10}$$

$$V_c = V_{ref} \sin(\theta - 240°) \tag{11}$$

Motor voltage command signals 32 of the controller 18 are applied to a power circuit or inverter 20, which is coupled with a power source 22 to apply phase voltages 34 to the stator windings of the motor in response to the motor voltage command signals 32. But in order to generate phase voltages 34 with an average sinusoidal shape, switching devices 50 (See FIG. 4A) of the inverter 20 must be turned on and off for specific durations at specific rotor angular positions. Control of the inverter 20 may be implemented according to any appropriate pulse width modulation (PWM) scheme.

More generally, a voltage control schematic can be shown in FIG. 2. Where V at block 36 may be considered a function of the torque command Tcmd, and the angular speed of the PM motor 12 rotor. And the duty cycles of each phase are functions of phasor voltage V, power bus voltage Vdc, and rotor position θ, as well as angle correction δ. In other words, for a PM brushless machines used in voltage mode control, a method achieves torque control by regulating the motor voltages. By using the motor parameters (e.g. torque constant Ke) and speed (e.g., ω), a controller 18 calculates the voltage required to produce a desired torque. The controller 18 is implemented using feedback signals from rotor position 24 and speed 26.

It can be seen from equation (12) that in the PM machine, torque is a function of the motor current for a constant back EMF $\overline{E}$ and phase angle.

$$Tor = 3K \frac{\overline{I}}{\sqrt{2}} \cos(\alpha) \tag{12}$$

where K is the motor torque constant, $\overline{I}$ is the current vector and (α is the angle between back EMF $\overline{E}$ and current vector $\overline{E}$.

It is noted that measured phase current $\overline{I}$ is not used in the control algorithm above. As stated earlier, motor current may be adversely affected if the appropriate voltage is not applied to the motor 12. Therefore, some means for monitoring the motor voltage and operation is appropriate.

Figure 3A:
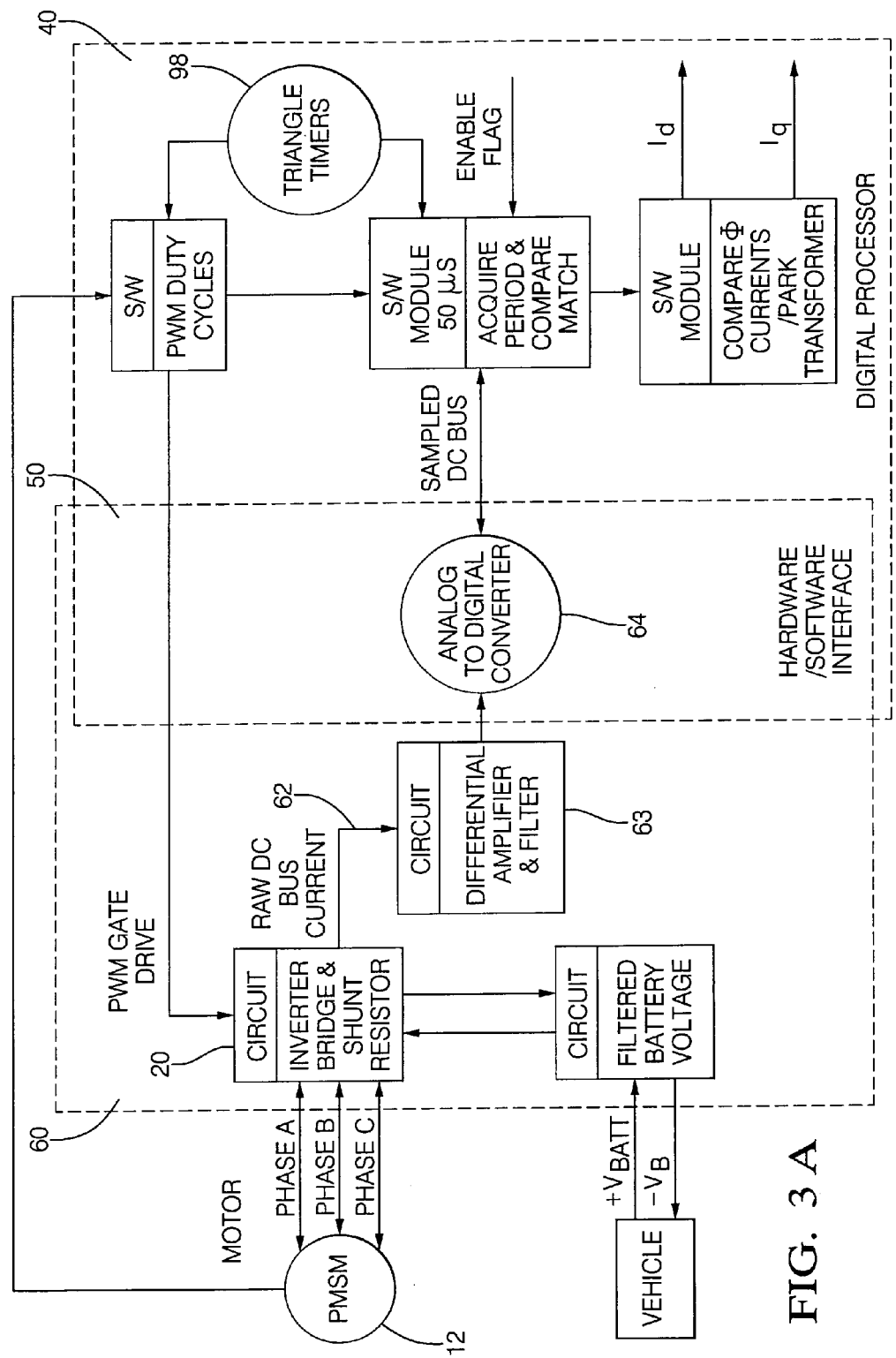
FIG. 3A is a conceptual drawing depicting a PM motor system of an exemplary embodiment.
Figure 3:
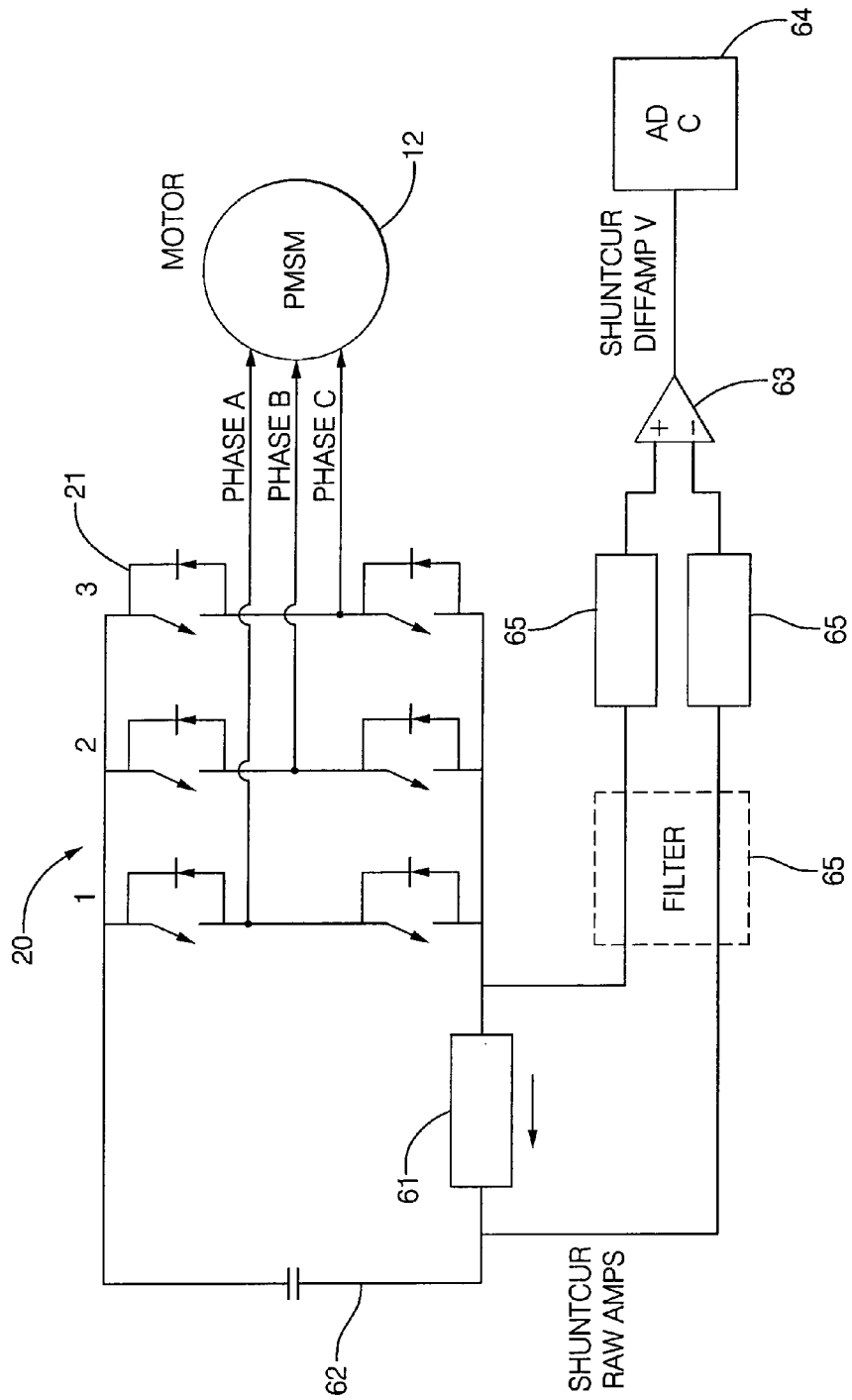
FIG. 3B depicts a inverter circuit with a shunt sensor for sensing phase currents of an exemplary embodiment.

Referring now to the inverter circuit shown generally in FIG. 3B and the overall drive system in FIG. 3A, the system of the preferred embodiment realizes that the system can be evaluated for faulty operation of the drive system by sensing the DC bus current using a shunt current sensor 61 and determining the three phase currents and the relationship between the bus current, the three phase currents and the pulse width modulation (PWM) duty cycles.

Significantly, in accordance with the overall teachings of the invention, a single shunt current sensor 61 (FIG. 3B) may be used. Thus, the need for a sensor on each and every phase is eliminated and an effectively continuous measurement of the phase currents is achieved using the single shunt current sensor 61.

It is now appropriate to reflect and expand upon on the above discussion in context and in accordance with the overall teachings of the invention, which may utilize shunt current sensor 61 on the DC bus 62. As noted above, the general method of controlling a PM synchronous motors 12 for steering applications, is by profiling the motor voltage to the motor rotor position with preset parameters. Also as noted above, the voltage mode control method shown in FIG. 2 does not use motor current information for motor control. Instead, the motor voltage vector is directly calculated from the motor model.

However, a major disadvantage of such a voltage mode control is that the control algorithm becomes machine parameter dependent. As machine parameters can change with manufacturing and operating conditions, such as the winding temperature and flux level, the performance of the voltage mode controlled system cannot be easily maintained. In particular, torque control precision may be degraded resulting in an unsatisfactory system dynamic response.

Additionally, typical voltage control algorithms are based on the assumption that all three-phase resistances are equal. Thus, the differences between these resistances due to temperature variations and manufacturing tolerances may create an undesirable torque ripple. Additionally, typical voltage mode control methods are also feed forward control methods; therefore there is no direct way for verifying the validity of output torque. In an automotive electronic steering system for example, torque ripple is a major issue and concern.

Thus, in accordance with the overall teachings of the invention, it is realized that motor current information can be used to overcome the above problem of the voltage mode control and thus satisfy performance and safety criteria under various operating conditions in a manner that also does not introduce additional errors. Since the changes in temperature or manufacturing tolerances are slow changing or constant variations, real time current information is not always necessary. Also, it is not always necessary to measure current in all three phases at the same time. Thus, in an embodiment herein, it is realized that motor current can be sensed from a DC bus current sensor, even at a very low frequency if desired, using either the current vector or torque current for parameter compensation and output torque validation.

Thus, the present method may use the difference between the desired current and the actual current in the machine for motor parameter and phase imbalance compensation and also for checking the validity of output torque. In order to estimate the parameter accurately, an accurate measurement of current is required. Also, the current feedback may be used to estimate the motor temperature for the thermal duty cycle control or to estimate other parameters.

Additionally, it is realized herein that one method to obtain the full information about the motor currents is to measure it directly from the motor phases using three individual current sensors, and optionally to protect the DC link using a fourth-current sensor. However, the cost of three sensors may be high. Moreover, the variation of the current between the individual sensors induces an error in the effective torque and flux current measurement which is used for the parameter estimation and duty cycle control. Therefore, use of a single current shunt sensor 61 may be used in the present preferred embodiment for determining the q and d axis (rotor reference frame) motor current using a single dc bus current sensor in a Permanent Magnet Synchronous Machine (PMSM) drive. A control algorithm is designed to take advantage of the way the PWM control pulses are generated to sample the DC bus current at appropriate times in the duty cycle in order to use the DC bus current sensor to measure the motor phase currents $i_a$, $i_b$, $i_c$, and the $i_q$ motor torque current and flux current $i_d$.

Thus, in accordance with the overall teachings of the invention, the torque-producing motor current $i_q$ and flux component of current $i_d$ may be determined and used to stabilize performance over the life and operation of the motor. The voltage is measured across the shunt resistor to obtain the current by way of Ohm's law. This voltage measurement is filtered and amplified before being sampled by an analog-to-digital converter. Significantly, at specific positional locations in the DC bus current the AC phase currents $i_a$, $i_b$, $i_c$ according to duty cycles. The two PWM positional locations are called herein Period Match and Compare Match. These specific positional locations are calculated by the Pulse Width Modulation (PWM) generation function, which drives the inverter bridge according to duty cycles. The two currents sampled at Period Match and Compare Match represent the phase currents in two of the six switches 50 which may be transistors in the inverter bridge 20. Three-phase motor position feedback may be used to calculate which of the six switching sectors the currents are sampled in or the commanded duty cycles may indicate the sector. Once this is known, all three motor phase currents are computed. A Park Transform function calculates the q-axis and d-axis rotating reference frame currents (torque current $i_q$ and flux current $i_d$) from the phase currents and motor position feedback. The computed q-axis current may then be used for output torque validation and parameter compensation. Thus, with the general concept in mind, more specific details are discussed below.

Figure 6:
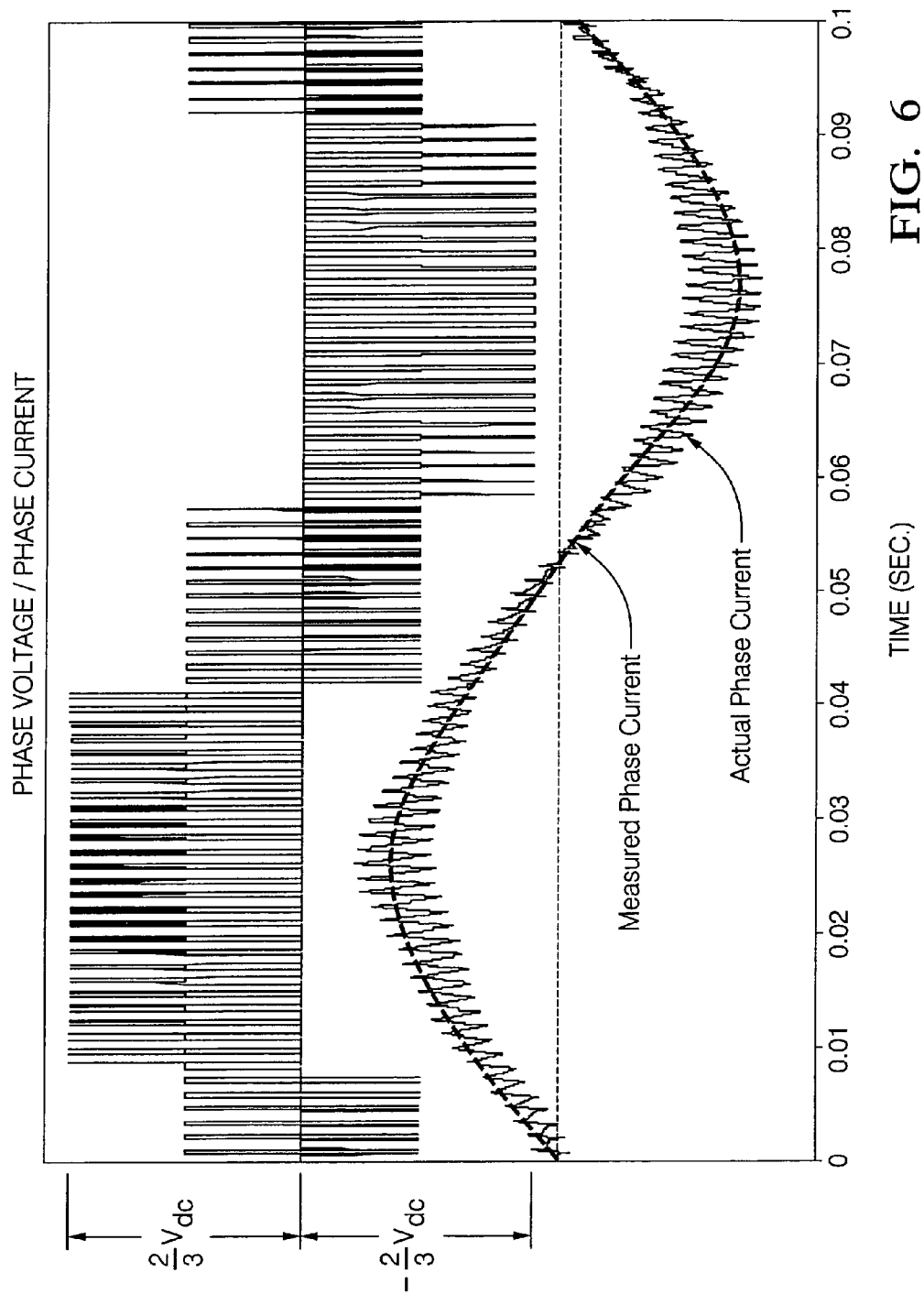
FIG. 6 is a diagram depicting a relationship between pulse width modulated pulses and the resultant phase current.

With reference to FIG. 3B, it is seen that a Permanent Magnet Synchronous Machine (PMSM) 12 is provided in the form of a three phase motor. This motor is driven by alternating (AC) phase currents $i_a$, $i_b$, $i_c$, according to duty cycles which provide motion to a rotor (not shown) in the PMSM 12. Drive circuit 60 includes the inverter 20 and transforms a DC bus current 62 into the three AC phase currents, $i_a$, $i_b$, $i_c$, as shown in FIG. 3B. The inverter 20 is driven by Pulse Width Modulation (PMW) according to duty cycles in order to use and transform the DC bus current. A general illustration of the relation between pulse width modulation and the resultant phase current signal is shown in FIG. 6 wherein current pulses are applied for certain time intervals which are known as the duty cycles. In this manner, the motor phase current waveform shape is generated by pulse width modulation (PWM). In this example, the fundamental PWM frequency dithers around 20 kHz (50 μs period). Therefore, in one 50 μs window, the motor phase current exponentially rises and falls as a function of the applied voltage pulse and stator inductance with the rotor. As seen in FIGS. 3A and 3B, a differential amplifier 61 measures the voltage across the shunt sensor 61 which may be a resistor, located on the inverter ground bus 62. Appropriate filtering of the shunt measurement is useful based upon the common-mode noise of the inverter (switching time, switch capacitance, parasitic capacitance, snubber circuits). Typical implementation could consist of a common-mode choke and low-pass RC filters 65. An analog-to-digital converter 64 samples the output of the differential amplifier 63.

The analog-to-digital converter 64 may serve as a hardware to software interface 50 as shown in FIG. 3A. A suitable computer or digital processor or digital signal processor (DSP) 40 receives input from the hardware to software interface 50. The digital processor samples the bus current and also controls the Pulse Width Modulation (PMW) by using the duty cycles and other information such as position of the rotor of voltages of the phase currents, as explained in more detail below. Thus, because the digital processor is in control of the system, it can sample the bus current at appropriate times and determine the phase currents from the bus current, as explained in more detail below.

Figure 8:
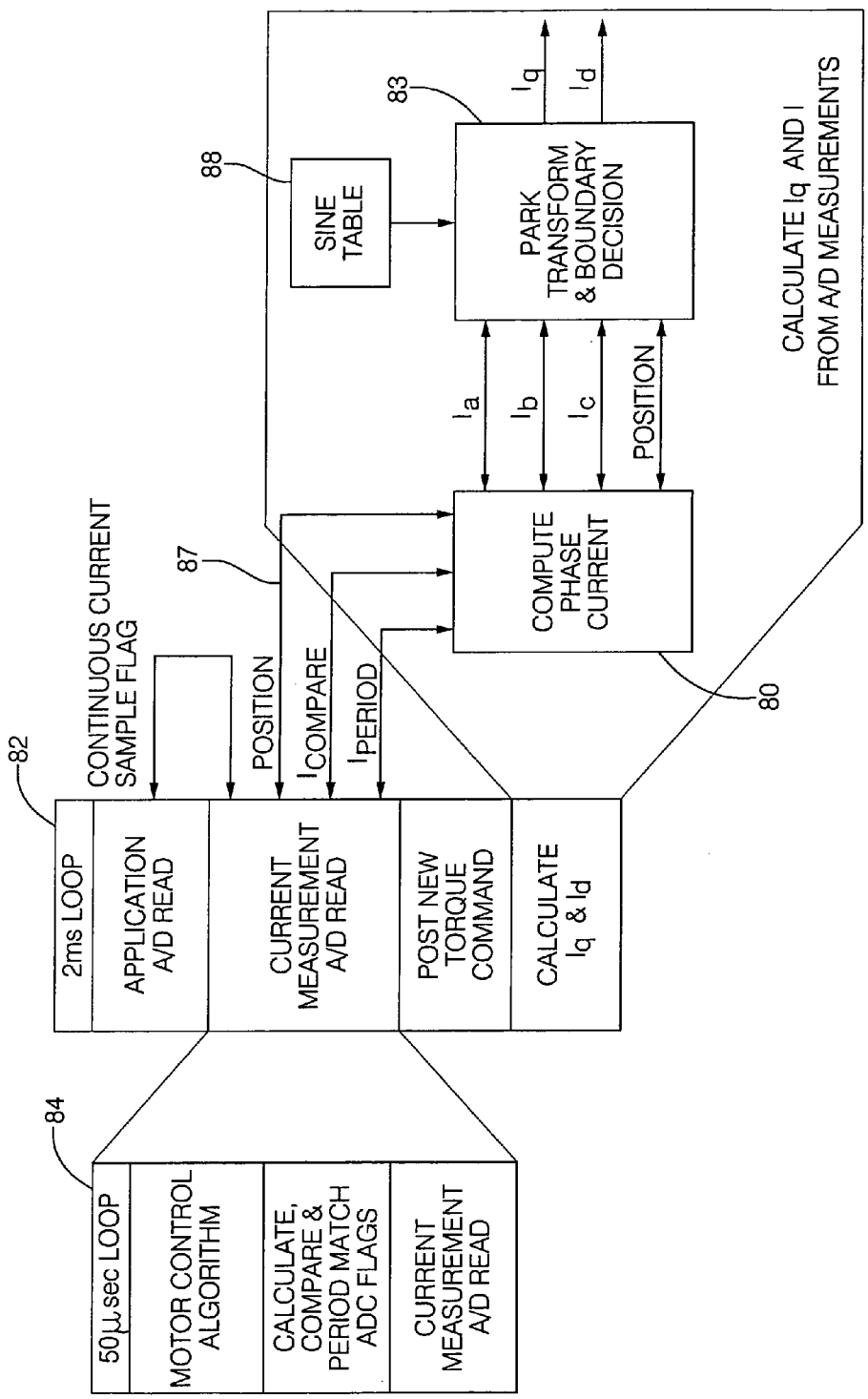
FIG. 8 is a conceptual diagram depicting control loops of an exemplary embodiment of the system.

The A/D converter (ADC) 64 defines the interface between the hardware and the software. FIG. 8 shows a high-level description of the overall system and control process and shows the two control loops of an exemplary embodiment. The main loop 82 is a 2 ms loop which contains 50 μs sub loop(s) 84 within it. In the 50 μs sub loop 84, current sampling occurs and the ADC 64 reads the current in the shunt resistor. As the sampling occurs every 50 μs, this function is designated as a continuous phase current sample and is enabled by a flag. PWM modulation also occurs in the 50 μs sub loop(s). The last valid value read by the ADC 64 is then used for Iq and Id calculation using a Park Transform in the 2 ms main loop. It also noted herein that the Park Transform is not necessary at some boundary regions. The Iq torque value therefore provides a value from which to check output torque. Additionally, the measurement instantaneous phase currents $I_a$, $I_b$, $I_c$, can be used for parameter compensation.

Figure 4:
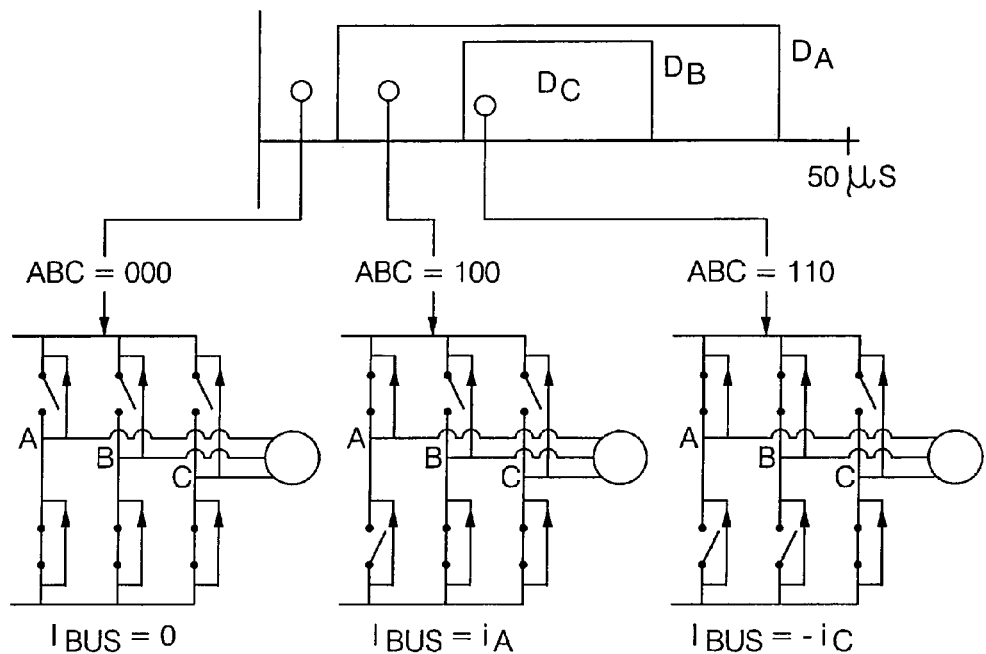
FIG. 4A depicts the inverter switching states and associated switching devices.
FIG. 4B depicts the relationship between the DC Bus currents correlating to phase currents and an inverter switching device states.
Figure 4:
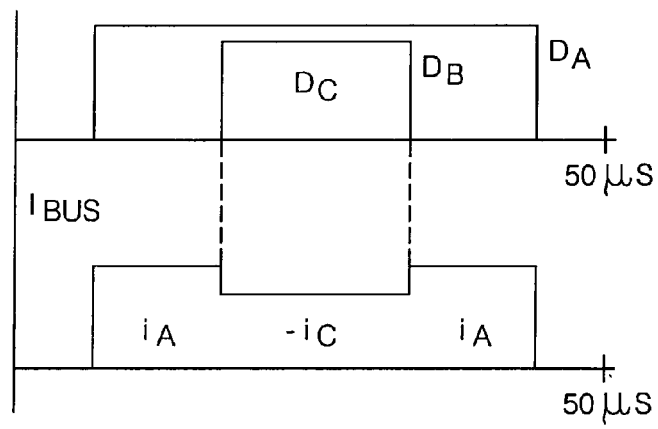
Figure 5:
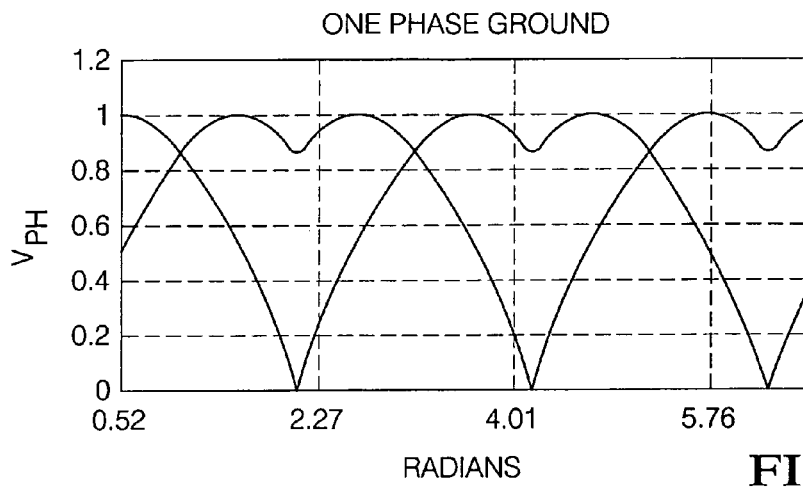
FIG. 5A depicts phase to ground voltages from an inverter applied to the motor as a function of position.
FIG. 5B depicts the line to line voltages from the inverter applied to the motor as a function of rotational position.
FIG. 5C is a more detailed depiction of the relationship between the DC bus current, the voltage sectors and the correlating phase currents.
Figure 5:
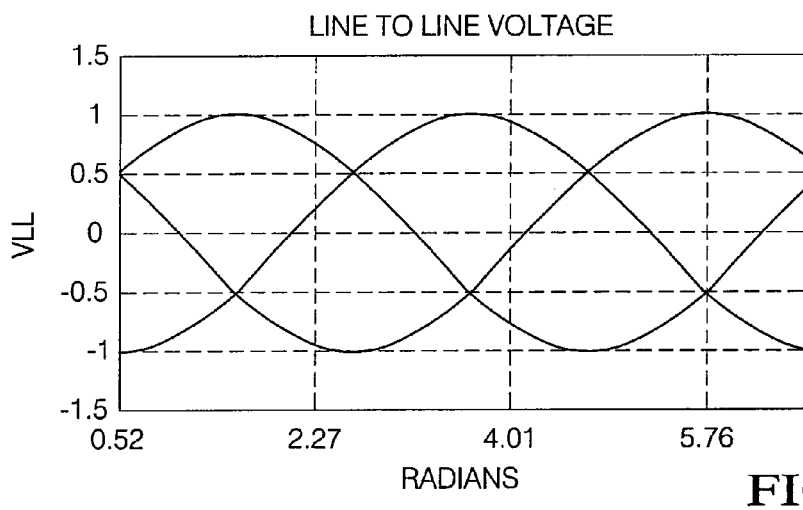
Figure 5:
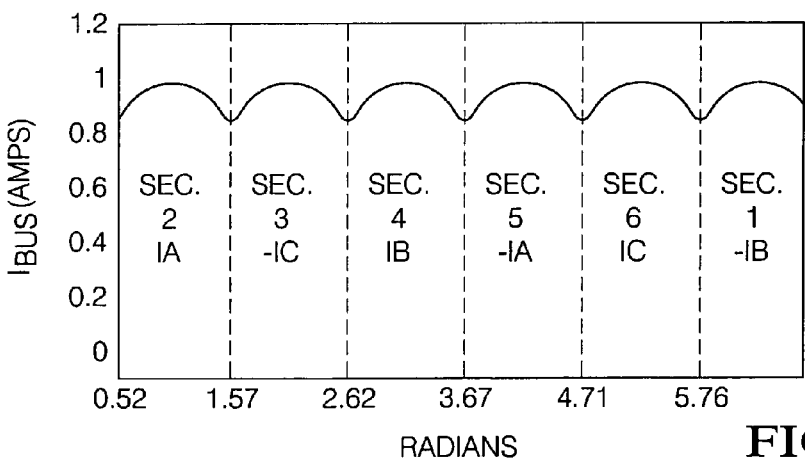

As the DC bus current 62 is measured in the shunt current sensor 61, a good understanding of the relationship between the DC bus current and the motor current is significant to understanding the concept employed herein. The shape and amplitude of the DC bus current depends upon the angle between phase motor current $\overline{I}$ and phase voltage $\overline{V}$ (see FIG. 1). FIG. 4A depicts the switching of inverter 20 and the DC bus current 38 during one switching cycle of the inverter 20 for switching State 2 of the rotor position. The inverter 20 goes through six switching states during each inverter switching cycle. FIG. 4B depicts the duty cycles of the switching devices 50 of the inverter 20 and the correlating contribution to the DC Bus current for switching state 2. It can be seen that the DC bus current 38 appears as pulses with a frequency equal to the switching frequency of the inverter 20. As shown in FIG. 5a, at any instant during each PWM cycle the DC bus current is equal to one of the three phase currents and this current is commutated through two phases during each PWM cycle. Therefore two phase currents can be measured from the DC bus current during each PWM cycle. Thus by sampling the current at these instances during each switching cycle two phase currents can be measured. The sum of three phase currents is equal to zero in a wye connected motor. Therefore, the two currents are enough to get the complete current information of the motor.

Figure 7:
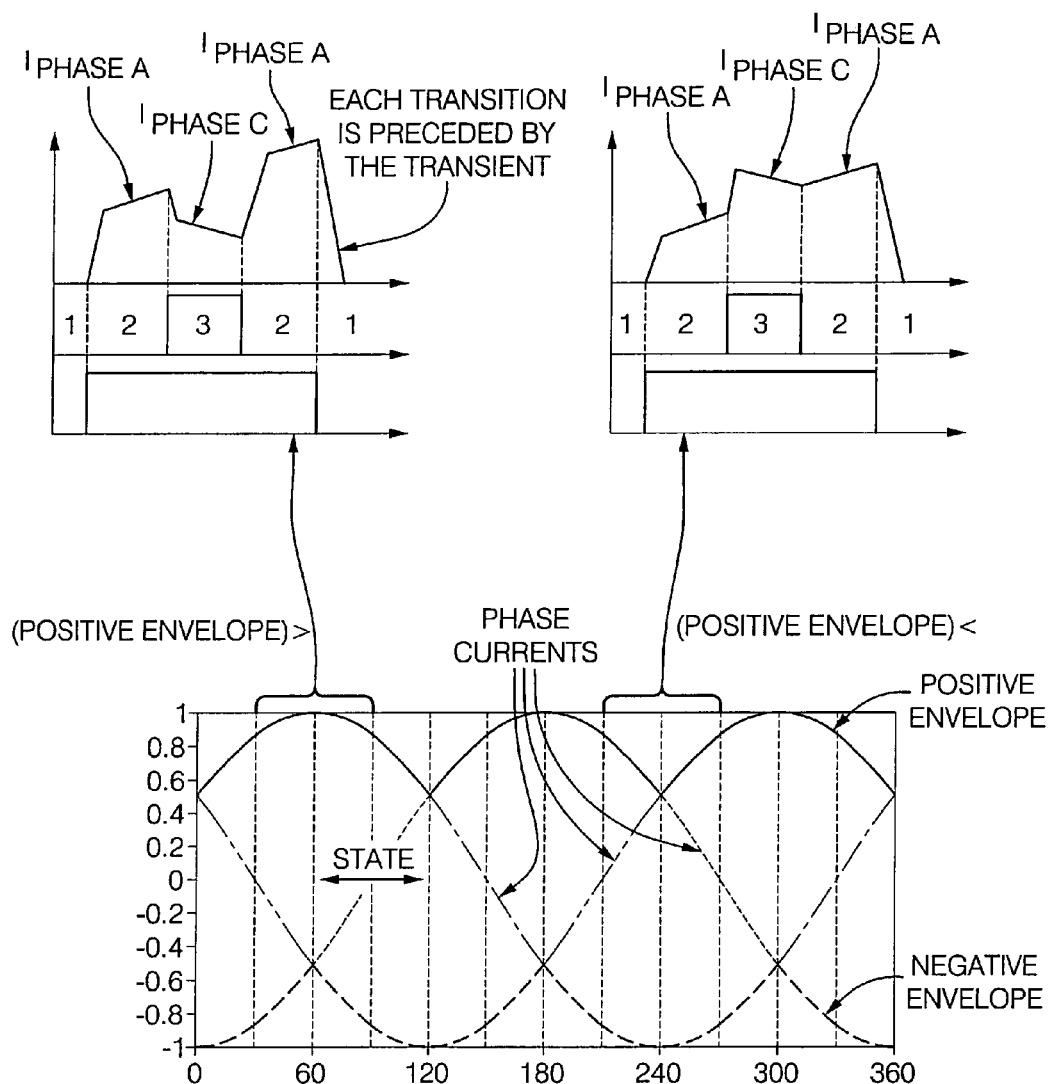
FIG. 7 is a diagram depicting a relationship between a sensed shunt current and three phase currents.

Referring to FIG. 7, the shunt current shall be described. In this figure, the PWM is generated by "phase grounded" references. This means that the ground reference is the negative envelope of the three sinusoidal phases rather than zero. The implication on the DC bus 62 is that there are only two switches 50 in the upper and lower bridge opening and closing during one PWM cycle rather than three. Therefore, two (and only two) phase currents are always represented in the bus current in alternating fashion. Depending on the magnitude of the phase current, the bus current may have the wave shapes shown in FIG. 7 (state 2 shown as an example). A linear approximation is shown for the exponential PWM response of the stator and bus inductance. The PWM noise is not shown in the phase current diagram (see FIG. 6).

PWM for a three phase PMSM is typically center-based. Center-based PWM may be generated by a continuous triangle-wave timer 98 (PWM Timer). This triangle-wave timer is managed by the Event Manager 91. The desired sinusoidal phase currents $I_a$, $I_b$, $I_c$ are digitally reproduced in software 92 based on the motor position feedback 87, sine look-up tables 86 and a computed modulation index (based on motor speed and torque). Each sinusoidal reference signal is modulated by this timer 98 in order to produce sinusoidal currents $I_a$, $I_b$, $I_c$ from a dc supply. The dc-ac converter is called an inverter 20, and consists of six power transistor switches 21 which are controlled by duty cycles (See FIGS. 4a–4b). The modulated switch-inverter 20 produces ac current because of the inductive storage of energy in the motor windings. Therefore, one only has to know where the timer 98 is to know where to sample for motor current.

Figure 9:
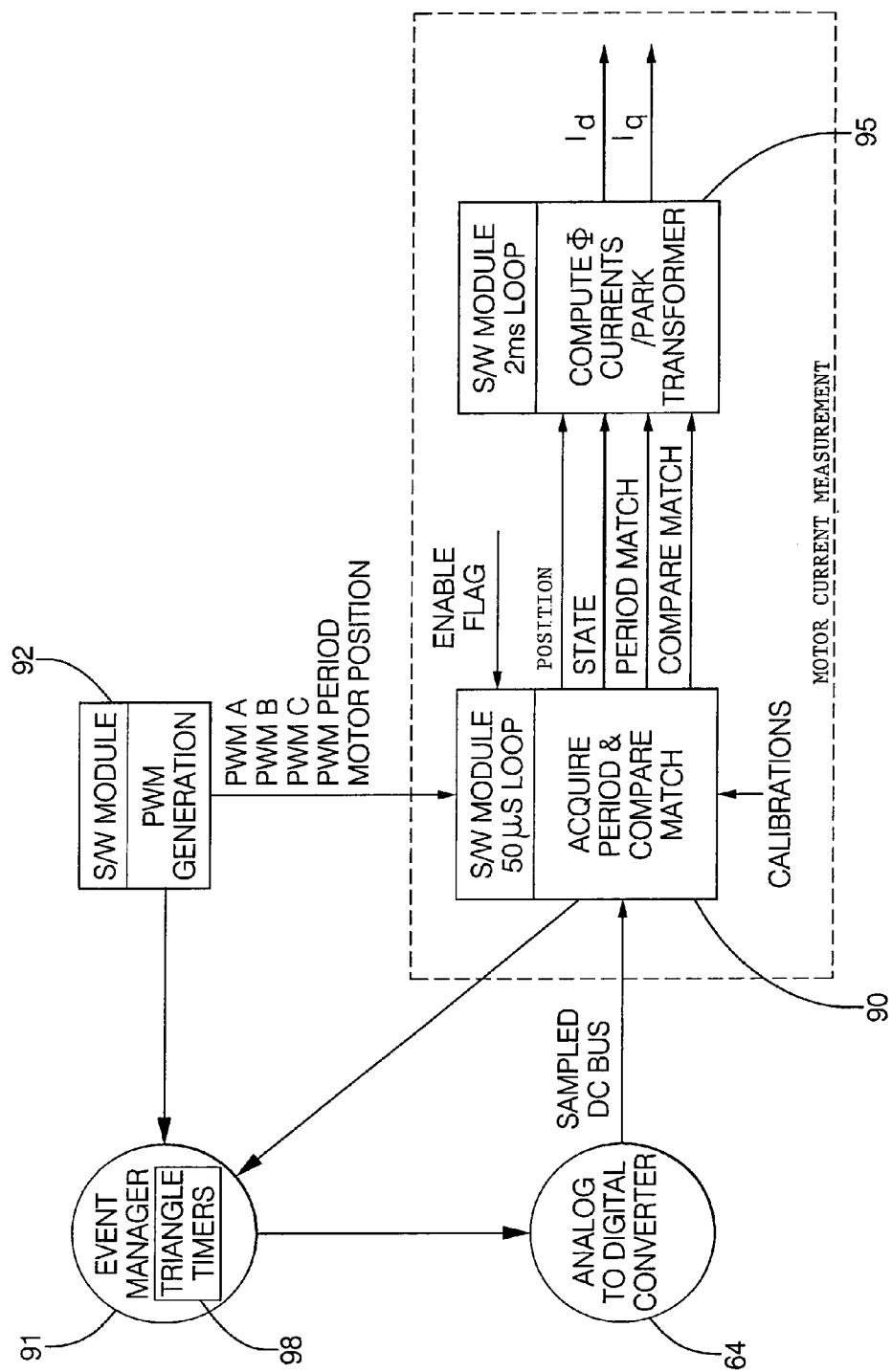
FIG. 9 is a conceptual diagram of exemplary software associated with an exemplary embodiment.

In FIG. 9, it is shown that the PWM generation 92 is highly integrated with the current measurement 90. The PWM generation 92 is highly integrated with the Event Manager 91. The function of the Event Manager 91, in the generation of PWM, is to also trigger a circuit, which may be a sample & hold circuit, for A/D conversion of the bus current. Therefore, there may be software management of the current measurement module 90 and the PWM generation module 92 with the Event Manager 91 and the A/D converter 64 sub functions.

Figure 9A:
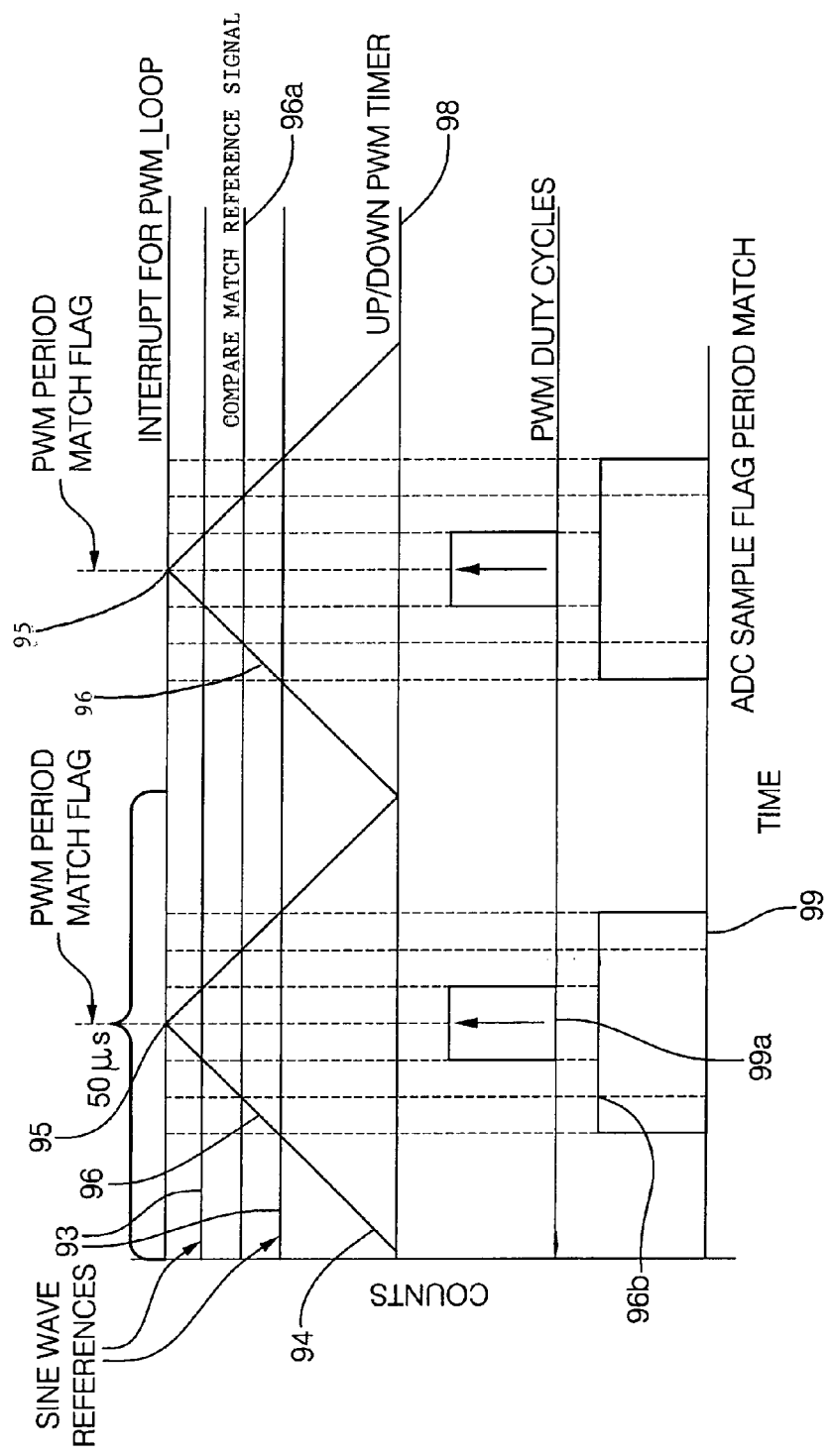
FIG. 9A is a conceptual diagram of the compare match and period match sampling of an exemplary embodiment of the system.
Figure 9:
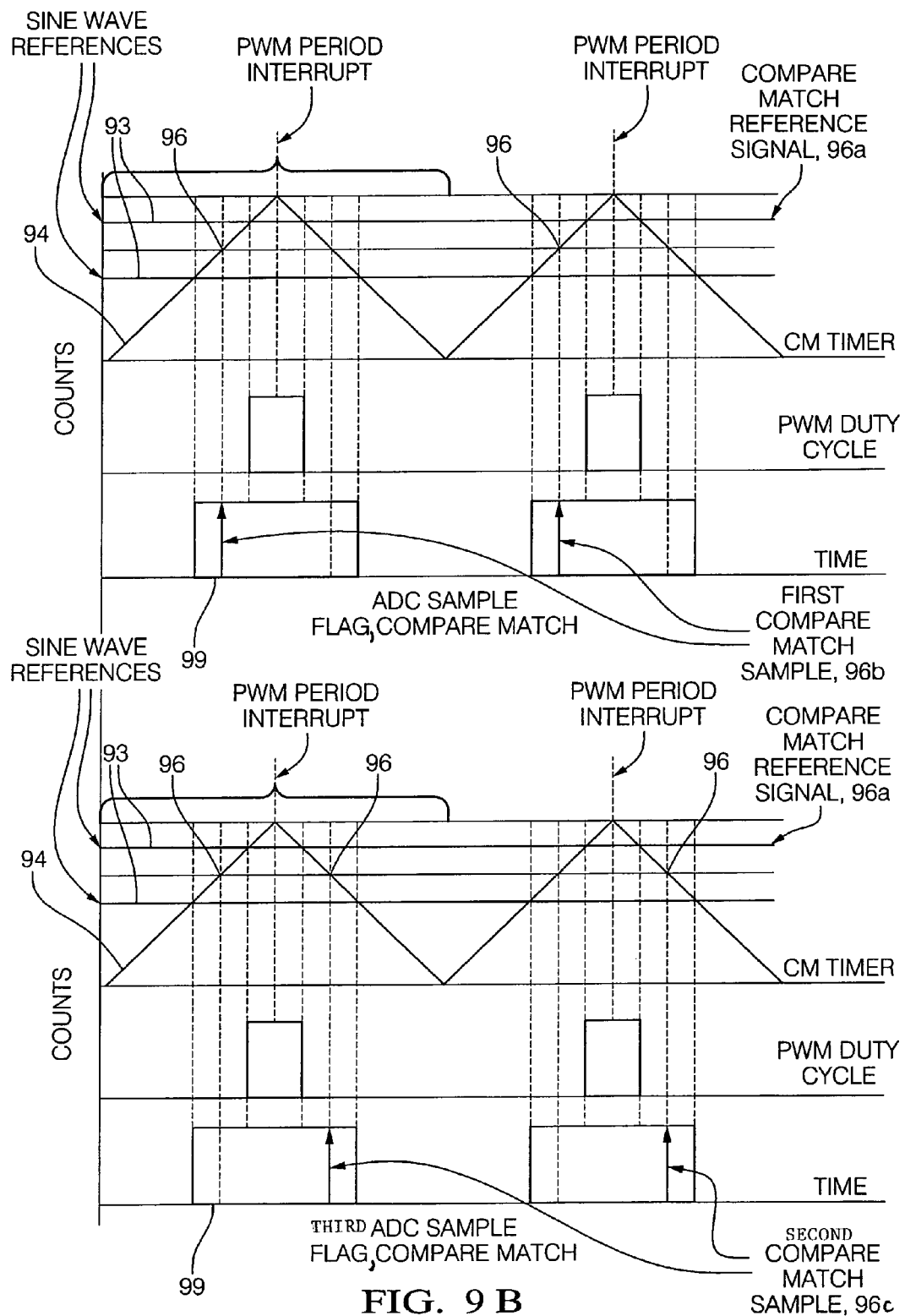

Referring to FIGS. 3A, 9 and 9A, the PWM-Based Sampling will be explained. The A/D converter 64 samples the bus current 62 (Vdc_bus_raw) from the shunt sensor 61 from two flags generated in an Event Manager 91. The first flag (see up arrows in FIG. in FIG. 9(*a*)) is generated by a reference signal termed Compare Match 96 while the second flag termed Period Match 95 is generated by the PWM at the duty cycle center 99*a* (See up arrow in FIG. 9A). The Event Manager 91 generates the gate drive PWM duty cycles 99 (see FIG. 4B) by comparing an up/down timer 98 (waveform 94) and two sine wave reference signals 93. The Period Match 95 A/D sample point measures the bus current (Vdc_bus_raw) at the duty cycle center 99*a* (see FIG. 9A) generated by the combined PWM duty cycles 99 (see FIG. 9A). The timer 98 used to generate this sampling signal is set up in an up/down counting mode as shown in FIG. 9A. It is noted herein that various and multiple timer arrangements are also possible. For example, the timer that is used may be the timer used to generate the PWM switching signal for the phase voltage or another timer can be synchronized to run with the Voltage PWM timer. The sampling signal is generated at the Period Match 95 of the timer which falls at the center of PWM period, which corresponds to the center of the duty cycle 99*a* (See FIG. 9A). Therefore, the timing of the Period Match 95 sampling is straightforward.

In contrast, referring to FIG. 9*b*, the Compare Match 96 sampling of the Compare Match Reference Signal 96*a* timing is computed from the average of two sine wave PWM signals 93. The timer used to generate this signal is configured to run in up count mode as shown in the FIG. 9B. This enables two Compare Match 96 samples 9(see flags 96*b* and 96*c*) to occur during each PWM duty cycle 99. The zero of compare timer is synchronized with the voltage PWM timer. This computed reference signal is shown along with the Period Match in FIG. 9A. As seen in FIG. 9B the actual A/D sample point of the Compare Match 96, however, is triggered by the up timer 94 at the Compare Match reference signal 96*a*. By averaging the reference signals 93 and taking the Compare Match 96 sampling as shown in FIG. 9B, it is readily seen that a good value of sampling 96*b* and 96*c* which is not located at the edge of the duty cycle 99 timing, i.e., not near any associated switching by commutation, is achieved.

The A/D converter 64 samples the shunt current (Vdc_bus_raw) from flags generated in the Event Manager 91 on the Timer(s) 98. These are not interrupt flags, but interrupt flags may be generated also depending on implementation. The flags are triggered by Compare Match 96 and Period Match 95 threshold matches on the timer(s) (see FIG. 9A). The first flag is generated by a Compare Match 96 of the timer and the average of two sinusoidal PWM reference signals. The two sine wave reference signals 93 are made possible by the phase grounding commutation scheme (see FIG. 5A). Actual implementations may also use half PWM widths. The resulting Compare Match 96 will cause an A/D sample at the center of the first PWM shoulder 96*b*.

Figure 9C:
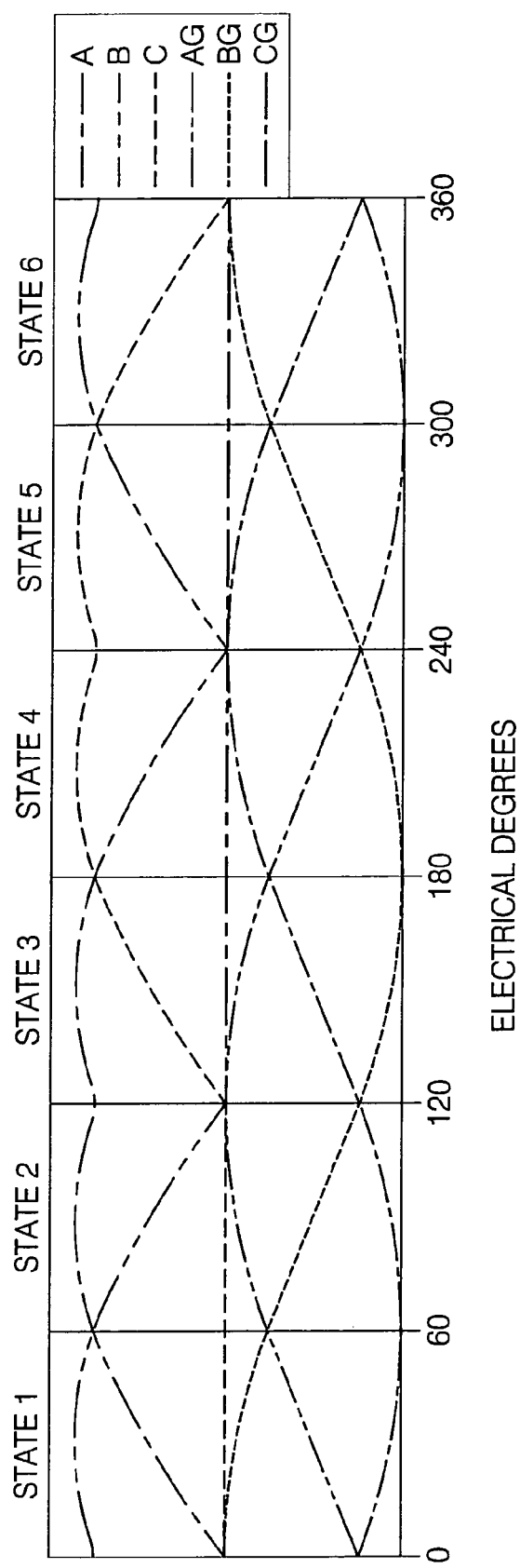
FIG. 9C is a diagram of phase current reference signals and associated states.
Figures 9D, 9E:
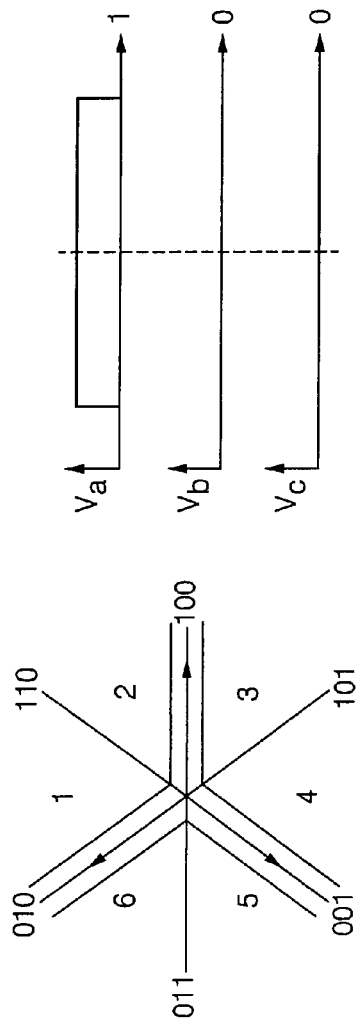
FIG. 9D is a table showing a relationship between voltage level of the three phases and indicates their state in vector space and also the instantaneous phase currents of an exemplary embodiment of the system.
FIG. 9E is a vector space diagram showing boundary state 100 and its associated duty cycle.
Figure 9:
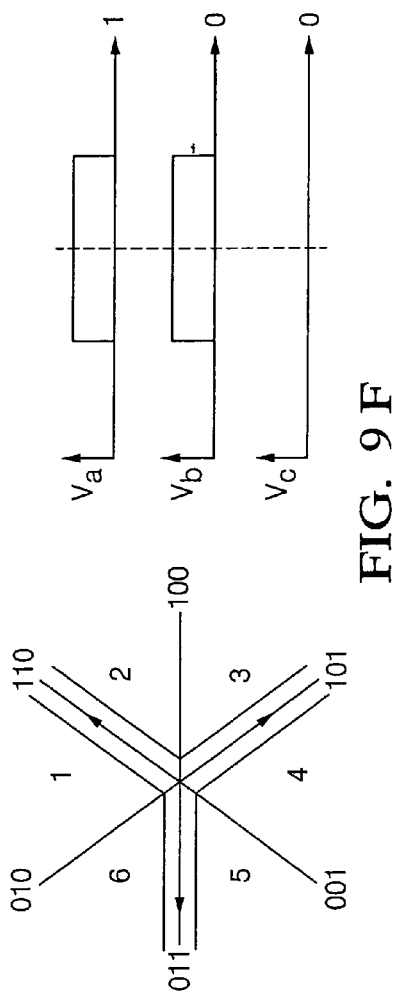
Figure 10:
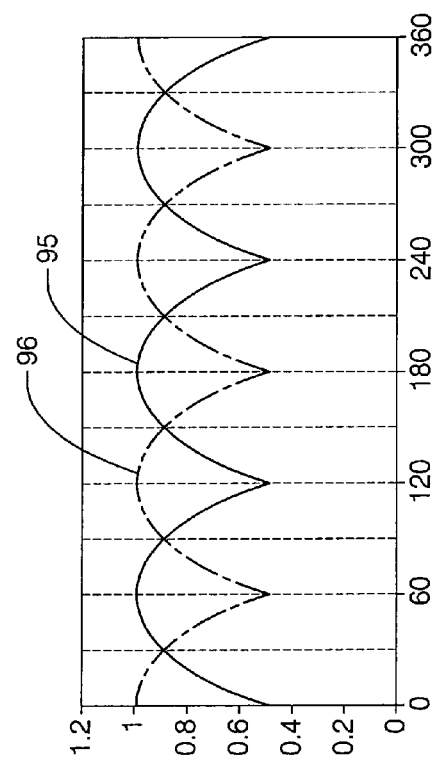
FIG. 10 is a diagram of one possible set of Compare Match and Period Match output waveforms.

When the Modulation Index is normalized, the resulting Compare Match 96 and Period Match 95 are waveforms with respect to position as shown in an example at FIG. 10. Comparing FIG. 7 to FIG. 10 and FIG. 5C it is seen that by grounding one phase and sampling at the negative or positive envelope that two phase currents can be sampled from the bus current and the third phase current can be computed according to the relations at FIGS. 9C and 9D.

The final output for the PWM-based current sampling in the 50 μs loop 90 is a Compare Match 96, Period Match 95, Captured State and Captured Motor Position.

The software design may appropriately integrate two Motor Current sub functions with the PWM generation 92, Event Manager 91 and A/D converter 64. The first Motor Current sub function runs in the 50 μs loop 90, with the PWM generation 92, while the other runs in a 2 ms loop. While both PWM generation 92 module and current measurement 50 μs loop 90 utilize the Event Manager 91, the two may be managed separately.

In an embodiment, the Event Manager 91 may be configured to run for both PWM Generation 92 and Current Measurement 90 (timer setup). All the necessary information needed to sample current from the Event Manager 91 shall be passed from the PWM generation module 92 to the current measurement module 90. The Current Measurement module 90 may call the Event Manager 91 to sample the current from the A/D converter.

When the collected motor current data is gathered in the 50 us loop 90 sub function, then the 2 ms loop sub function shall process that data into Iq an Id current.

The final output of Current measurement (Iq and Id) is used every 2 ms. Since the sampling must occur in the 50 μs loop, the strategy is to pull as much computation into the 2 ms loop as possible to reduce throughput time.

The phase currents can be computed once at any time in the 2 ms control loop after the 50 us loop is finished, or they can be computed in the 50 us loop with the PWM-based sampling. The latter implementation allows for filtering of the phase currents before the Iq and Id transform.

The timing of the chosen number of timers to be used must be synchronized to force the sampling at proper instances. However, as stated above many different timer configurations are possible. Any delay in timings can cause an error in the sampled current. Delay due to the inverter switching delays, hardware processing delays, and the software delays must also be compensated for. This is achieved by delaying the sampling instances at the compare and period matches.

The two currents sampled at Period Match 95 and Compare Match 96 represent the phase currents in two of the six transistors in the inverter bridge 20. The three-phase motor position feedback or the PWM duty cycle is used to calculate which of the six switching sectors or "state" the two currents were sampled in. Once this is known, all three motor phase currents are computed from the relationships shown in FIG. 9D based on the state number (see FIG. 9C). Referring to FIGS. 8 and 9C, the instantaneous phase current(s) $I_a$, $I_b$, $I_c$ are computed 80 at any time in the 2 ms control loop 82 after the initial application A/D reads. However, taking only one synchronous sample before a 2 ms Modulation Index posting is necessary. As discussed above, the phase current(s) are known by a computation of the state-space location. As shown in FIG. 9C, this computation can be performed from the three sinusoidal reference signals (A, B, C), or the phase grounded reference signals (AG, BG, CG). Alternatively, the phase current(s) may be computed from the duty cycle equivalents.

When the three motor phase currents $I_a$, $I_b$, $I_c$, are known (along with the motor position) a simple Park Transform (see 83 in FIG. 8) computation is performed to acquire the $i_q$ and $i_d$ currents in the rotor reference frame. After the current measurement flag triggers the ADC samples, the phase currents are computed first followed by this transformation.

$$\begin{bmatrix} i_q \\ i_d \end{bmatrix} = \frac{2}{3} \cdot \begin{bmatrix} \cos(\theta) & \cos(\theta - 2\pi/3) & \cos(\theta + 2\pi/3) \\ \sin(\theta) & \sin(\theta - 2\pi/3) & \sin(\theta + 2\pi/3) \end{bmatrix} \cdot \begin{bmatrix} i_a \\ i_b \\ i_c \end{bmatrix}$$

where θ is the motor position in electrical degrees with zero position of motor synchronized to zero position of phase A back-emf.

Thus at this point in summary, it has been discussed above how two of the instantaneous phase currents are sensed or determined from the motor by using Period Match and compare match sampling based on the PMW duty cycles. It has also been discussed how rotor reference frame $i_q$ and $i_d$ currents are determined. These values can be used to fine tune or compensate for the motor parameters and to check the output torque. Once the output torque is known it can be compared to a desired torque to check the validity of output torque. This has been accomplished by only using one shunt sensor 61 located on the DC bus which reduces the number of sensors and which reduces errors that occur between sensors.

Additionally it is noted that the Park Transform computation may be bypassed during the zero-cross and phase-cross boundaries. (This information is passed within the position data from the Event Manager.) During these transition states the measured phase current ($I_a$, $I_b$, or $I_c$) is actually equal to the q-axis current, therefore making the Park Transform unnecessary. However, the d-axis current is unavailable during these transition boundaries. During these transitions the q-axis current is made equal the one measurable phase current and the d-axis current measured in the last sample is held.

The selection of the Compare Match 96 and Period Match 95 ADC samples with a state-space location can be observed in the polar coordinate system for one electrical cycle. Each phase is represented by a 1 or 0 in the order ABC. Consequently, a 100, 010 or 001 refers to the peak of the sine wave or the center of the phase grounded double hump where two phases are always zero (0°, 120° and 240°). Equally important is the 110, 011 and 101 transition states where two phases are always equal (60°, 180° and 300°). These two transitional state categories may be evaluated in software processing.

Boundary states will be numbered 8, 9, 10, 11, and 12 herein. FIG. 9E shows the boundary condition for states 100(8), 010 (10) and 001 (12) (note: two phases are zero). The example shown for state 100 illustrates how there is no second pulse for the Period Match 95 sample. However, the Compare Match 96 sample is not affected. As one pulse widens and the other pulse shortens the Period Match will have enough pulse width to sample. This pulse width is approximately 600 ns in the current system. Within this boundary the Period Match is not sampled. During this region the $i_q$ current is directly equal to the current sampled during the compare match sample. The Park Transform (explained further below) is bypassed and the Compare Match 96 value is directly assigned iq. During this period $i_d$ retains the value calculated in the last valid sample. This transitional state category is designated as the zero-cross boundary or simply states 7,9 and 11 as shown in FIG. 9E.

FIG. 9F shows the boundary condition for states 110 (8), 011 (10) and 101 (12) where two phases are equal. The example shown for state 110 illustrates how there is no pulse to measure when the two signals are compared (Compare Match). However, the Period Match sample is not affected. As one pulse widens and the other pulse shortens the Compare Match will have enough pulse width to sample. This pulse width is approximately 600 ns. Within this boundary the Compare Match is not sampled. If read for $i_q$ processing in the 2 ms loop, the Park Transform is bypassed and the Period Match sample is used as $i_q$. This transitional state category is designated as the phase-cross boundary or simply States 8, 10 and 12.

There is also a third boundary condition where both pulse widths are too narrow for either the Compare Match or the Period Match sample. When this occurs the sampled current should be less than the minimum measurement requirement, and there should be no impact on the system due to the large error. If in the zero-cross boundary this applies only for the Compare Match sample. If in the phase-cross boundary this applies only for the Period Match sample. If large dv/dt from the switch-mode inverter corrupts the measurement due to parasitic capacitance, then the software may need to force this region of operation to zero. This is the implementation that will be used, and it may be designated as State 0. The default minimum pulse width calibration is 600 ns.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for obtaining motor current measurements from a DC bus current of an inverter that drives a pulse width modulated electric machine comprising:

sensing a DC bus current in a sensor located on a bus of an inverter;

sampling the DC bus current via an analog to digital converter wherein the sampling is controlled by sampling timing that is based on a pulse width modulation timing of the inverter, and further wherein the sampling comprises a first current measurement timed to occur at a point where an average of two sine wave reference signals intersects with a timer signal that is coordinated with the pulse width modulation timing of the inverter; and determining three AC phase currents of the motor from the sampled DC bus current.

2. The method of claim 1 further comprising:
determining a switching state of the motor from the sampling.

3. The method of claim 1 wherein the sampling occurs every 2 msec in a Pulse Width Modulated period.

4. The method of claim 1 further comprising:
determining a rotor reference frame torque motor current $I_q$ from the three AC phase currents and from a motor position signal.

5. The method of claim 1 further comprising:
determining a rotor reference frame flux current $I_d$ from the three AC phase currents and from a motor position signal.

6. The method of claim 1 wherein the sampling further comprises a second current measurement timed to occur at a point in the center of a duty cycle that is coordinated with the pulse width modulation timing of the inverter.

7. The method of claim 1 wherein the sampling occurs substantially continuously.

8. The method of claim 1 wherein the sampling occurs once a Pulse Width Modulated period.

9. The method of claim 1 further comprising: determining motor parameters to be adjusted by comparing the three AC phase currents of the motor to idealized motor phase values.

10. The method of claim 1 wherein the sensor is a shunt sensor.

11. The method of claim 1 wherein only two currents are sampled from the DC bus current in each sampling due to the a grounded switching pattern of the inverter.

12. The method of claim 1 further comprising:
measuring only one current during a transition period when a width of pulses is too small to measure two currents;
setting $I_q$ equal to the one current measured; and
setting $I_d$ to retain an $I_d$ value measured in a previous sample.

13. An arrangement for obtaining motor current measurements from a DC bus current of an inverter that drives a pulse width modulated electric machine, comprising:
a current sensor located on a DC inverter bus for sensing a DC bus current of an inverter;
an analog to digital converter for sampling the DC bus current obtained from the current sensor and for converting DC bus current samples to digital format for processing;
at least one timer for controlling the analog to digital converter in order to control the sampling wherein the timer is coordinated with a pulse width modulation timing of the inverter, and wherein the sampling comprises a first current measurement timed to occur at a point where an average of two sine wave reference signals intersects with a timer signal that is coordinated with the pulse width modulation timing of the inverter; and a control processor for processing the DC bus current samples and for determining AC phase currents from the DC bus current wherein the processor also controls the pulse width modulation timing of the inverter.

14. The arrangement of claim 13 wherein the sensor is a shunt current sensor.

15. A system for measuring current in a sinusoidally excited permanent magnet electric machine using only one current sensor comprising:
providing a controller for controlling pulse width modulation and duty cycles of an inverter that creates AC phase currents which drive a sinusoidally excited permanent magnet electric machine;
providing one and only one current sensor on a DC inverter bus of the inverter;
sensing a DC bus current via the sensor;
providing an analog to digital converter for sampling the DC bus current via the analog to digital converter;
sampling the DC bus current in the analog to digital converter wherein the sampling is controlled by sampling timing that is based on a pulse width modulation timing of the inverter, and further wherein the sampling comprises a first current measurement timed to occur at a point where an average of two sine wave reference signals intersects with a timer signal that is coordinated with the pulse width modulation timing of the inverter; and determining the AC phase currents of the motor from the sampled DC bus current.

16. The system of claim 15 further comprising:
a module for determining a rotor reference frame torque motor current $I_q$ from the three AC phase currents and from a motor position signal.

17. The system of claim 15 further comprising:
a module for determining a rotor reference frame flux current $I_d$ from the three AC phase currents and from a motor position signal.

* * * * *